United States Patent
Lee (10) Patent No.: US 6,501,161 B1
(45) Date of Patent: Dec. 31, 2002

(54) SEMICONDUCTOR PACKAGE HAVING INCREASED SOLDER JOINT STRENGTH

(75) Inventor: Kil Chin Lee, Seoul (KR)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/687,485

(22) Filed: Oct. 13, 2000

(30) Foreign Application Priority Data

Oct. 15, 1999 (KR) .............................. 99-44659

(51) Int. Cl.$^7$ ............................................. H01L 23/495
(52) U.S. Cl. .................. 257/676; 257/666; 257/670; 257/684; 257/784; 257/690; 257/692; 257/695
(58) Field of Search ................................. 257/666, 676, 257/670, 684, 784, 690, 692, 695

(56) References Cited

U.S. PATENT DOCUMENTS

| | | | |
|---|---|---|---|
| 4,530,152 A | | 7/1985 | Roche et al. .................. 29/588 |
| 4,987,475 A | * | 1/1991 | Schlesinger et al. .......... 357/70 |
| 5,041,902 A | | 8/1991 | McShane ..................... 357/79 |
| 5,070,039 A | * | 12/1991 | Johnson et al. ............. 437/207 |
| 5,157,480 A | | 10/1992 | McShane et al. ............. 357/74 |
| 5,172,213 A | | 12/1992 | Zimmerman ................ 257/796 |
| 5,172,214 A | | 12/1992 | Casto .......................... 257/676 |
| 5,250,841 A | * | 10/1993 | Sloan et al. .................. 257/666 |
| 5,278,446 A | | 1/1994 | Nagaraj et al. .............. 257/707 |
| 5,428,248 A | | 6/1995 | Cha ............................. 257/676 |
| 5,521,429 A | | 5/1996 | Aono et al. .................. 257/676 |
| 5,701,034 A | | 12/1997 | Marrs .......................... 257/706 |
| 5,783,861 A | | 7/1998 | Son ............................. 253/693 |
| 5,835,988 A | | 11/1998 | Ishii ............................. 257/684 |
| 5,866,939 A | | 2/1999 | Shin et al. ................... 257/666 |
| 5,894,108 A | | 4/1999 | Mostafazadeh et al. .... 174/52.4 |
| 5,977,613 A | | 11/1999 | Takata et al. ............... 257/666 |
| 5,977,630 A | | 11/1999 | Woodworth et al. ........ 257/712 |
| 6,143,981 A | | 11/2000 | Glenn ........................ 174/52.4 |
| 6,197,615 B1 | * | 3/2001 | Song et al. .................. 438/111 |
| 6,229,200 B1 | * | 5/2001 | Mclellan et al. ............ 257/666 |
| 6,242,281 B1 | | 6/2001 | Mclellan et al. ............ 438/106 |
| 6,294,100 B1 | | 9/2001 | Fan et al. ..................... 216/14 |

FOREIGN PATENT DOCUMENTS

| | | |
|---|---|---|
| JP | 57-45959 | 3/1982 |
| JP | 58-101317 | 6/1983 |

(List continued on next page.)

*Primary Examiner*—Albert W. Paladini
*Assistant Examiner*—Luan Thai
(74) *Attorney, Agent, or Firm*—Stetina Brunda Garred & Brucker (57) ABSTRACT

A packaged semiconductor having increased solder joint strength. The packaged semiconductor includes a semiconductor chip and a plurality of bond pads on the semiconductor chip. A leadframe includes a chip paddle, a plurality of tie bars connected to corners of the chip paddle and a plurality of dam bars. A plurality of leads connect to the leadframe, and are radially formed at regular intervals along and spaced apart from the chip paddle, and extend towards the chip paddle. A plurality of conductive wires electrically connect the leads and the semiconductor chip. Encapsulation material encapsulates the semiconductor chip, wires, chip paddle, and leads to form a package body, wherein dam bars formed on the leadframe limit flow of the encapsulation material. The chip paddle, plurality of leads and plurality of tie bars are externally exposed at peripheral side and bottom surfaces to allow depressions to be formed thereon. In one embodiment, at least one depression is formed on the bottom surface of at least one of the tie bars. In a second embodiment, at least one depression is formed on the bottom surface of the chip paddle. In a third embodiment, at least one of the leads has at least one depression formed on the bottom surface of the respective lead. The depressions may also be formed on the chip paddle, leads and tie bars simultaneously, or in combination to increase the friction required to readily maintain a sufficient solder joint strength when the package is mounted to a motherboard.

29 Claims, 6 Drawing Sheets

FOREIGN PATENT DOCUMENTS

| | | |
|---|---|---|
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 407297344 A * | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

\* cited by examiner

SEMICONDUCTOR PACKAGE HAVING INCREASED SOLDER JOINT STRENGTH

TECHNICAL FIELD

The present invention relates to semiconductor packages, and more particularly, but not .by way of limitation, to semiconductor packages with increased solder joint strength for mounting the semiconductor package to external surfaces.

HISTORY OF RELATED ART

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski, and incorporated by reference. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

Such conventional semiconductor packages are not without certain problems. Specifically, in a typical semiconductor package the bottom surface of the externally exposed leads is flat. The flat bottom surface of these externally exposed leads results in a weakening of the solder joint strength between the semiconductor package and an external surface, such as that of a motherboard. When the semiconductor package is mounted onto a motherboard or other surface by soldering, the flat bottom surface of the leads may lack enough friction to readily maintain a sufficient solder joint strength. As a result, the semiconductor package may undesirably detach from the motherboard at one or more critical locations. This is extremely undesirable and is a distinct disadvantageous aspect of prior art designs. The present invention addresses such problems by providing semiconductor packages with increased solder joint strength.

SUMMARY OF THE INVENTION

The present invention relates to semiconductor packages. More particularly, one aspect of the present invention comprises a semiconductor chip having an upper surface and a bottom surface in conjunction with the following features of the invention. A plurality of input bond pads and output bond pads on the upper surface of the semiconductor chip and along the circumference of the semiconductor chip are electrically connected to the semiconductor chip. A chip paddle is provided which has a top surface, a side surface and a bottom surface. The chip paddle, being bonded to the bottom surface of the semiconductor chip by an adhesive, also has corners, a circumference and a half-etched section at the lower edge along its circumference. A leadframe is also provided with a plurality of tie bars. Each of the tie bars has a side surface and a bottom surface. The plurality of tie bars are connected to the corners of the chip paddle. The plurality of the tie bars externally extend from the chip paddle and have a half-etched section. A plurality of dam bars are provided on the leadframe help limit flow of encapsulation material on the leadframe. A plurality of leads, referred to alternately as internal or external, connect to the leadframe. Each of the leads has a side surface and a bottom surface. The leads are radially formed at regular intervals along and spaced apart from the circumference to the chip paddle and extend towards the chip paddle. Each of the leads has a step shaped half-etched section facing the chip paddle. A plurality of conductive wires, comprised of a suitable conductor, are electrically connected to and between the plurality of leads and the semiconductor chip. Encapsulating or encapsulant material encapsulates the semiconductor chip, conductive wires, chip paddle, and the leads to form a package body. The flow of the encapsulation material is limited by the dam bars formed on the leadframe. The dam bars also serve to stabilize the leads on the leadframe. After encapsulation, the chip paddle, leads, and tie bars are externally exposed at respective side and bottom surfaces.

The above described assembly further includes, in accordance with the present invention, at least one depression formed on the externally exposed bottom surface of the leads to improve the solder joint strength with a motherboard. Alternately and additionally, at least one depression may be formed on the externally exposed bottom surface of the leads. Likewise, at least one depression may be formed on the externally exposed bottom surface of at least one tie bar to increase the solder joint strength. The presence of the depressions in the respective locations of the semiconductor package serves to provide an additional area which may fuse with the solder, thereby strengthening the solder joint strength between the semiconductor package and the motherboard.

BRIEF DESCRIPTION OF THE DRAWINGS

A more complete understanding of the method and apparatus of the present invention may be obtained by reference to the following detailed description when taken in conjunction with the companying drawings wherein.

DETAILED DESCRIPTION

Figure 1:
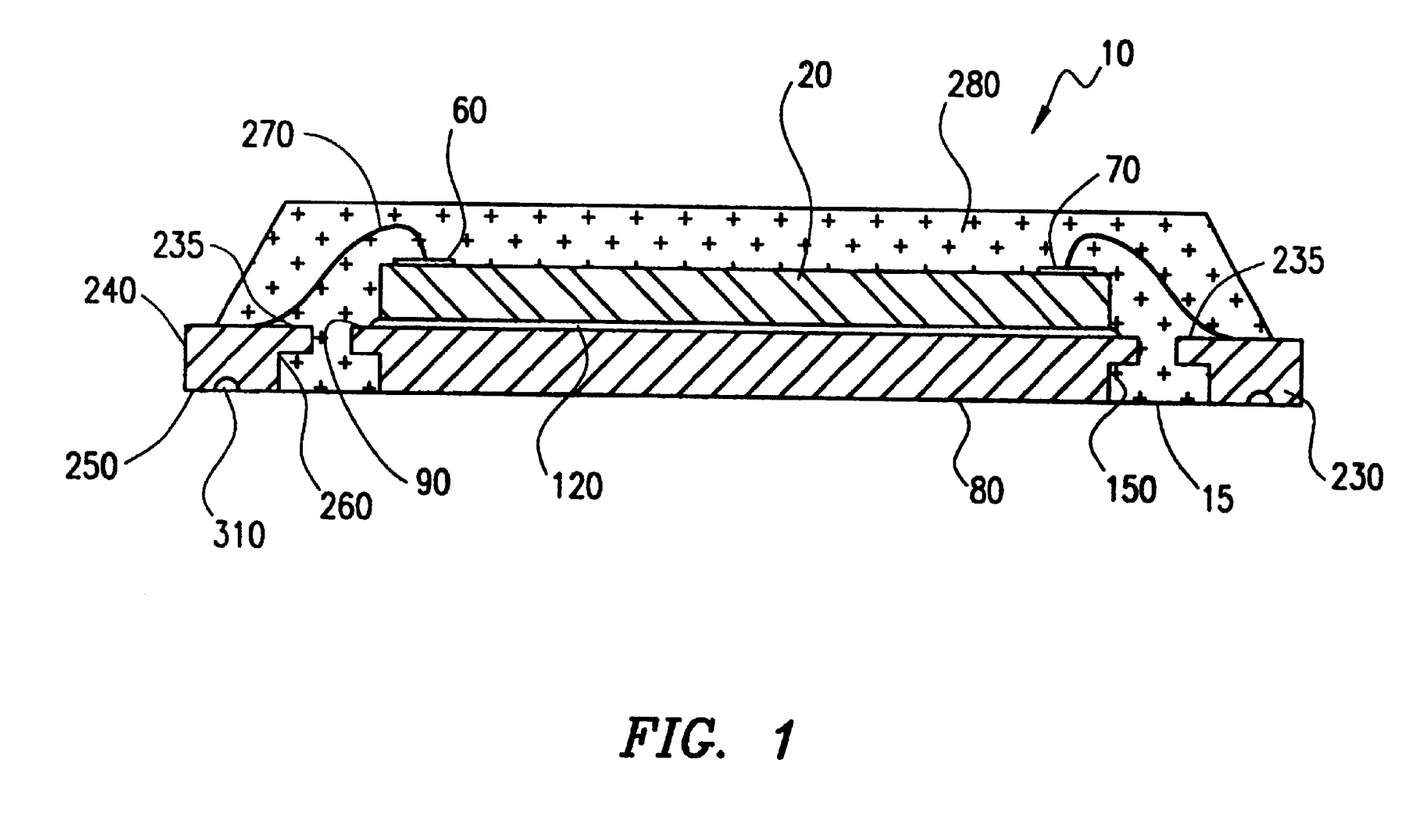
FIG. 1 ia a side elevational, cross-section view of a preferred embodiment of the semiconductor package of the present invention, wherein depressions are formed on the externally exposed bottom surface of the leads.

Referring first to FIG. 1 there is shown a cross sectional view of one embodiment of a semiconductor package constructed in accordance with the principles of the present invention. The semiconductor package includes a corner 12 and bottom surface 15. The semiconductor package includes a semiconductor chip having an upper surface 30, a circumference 40 and a bottom surface 50. A plurality of input bond pads 60 and output bond pads 70, collectively referred to as bond pads, are disposed on the upper surface of the semiconductor chip 20. A chip paddle 80 having a top surface 90, a side surface 100 and a bottom surface 110 is secured to the bottom surface 50 of the semiconductor chip via an adhesive 120. The chip paddle 80 has corners 130, a circumference 140 and may include a half-etched section 150. The half-etched section 150 is located at a lower edge 160 of the chip paddle 80.

Figure 2:
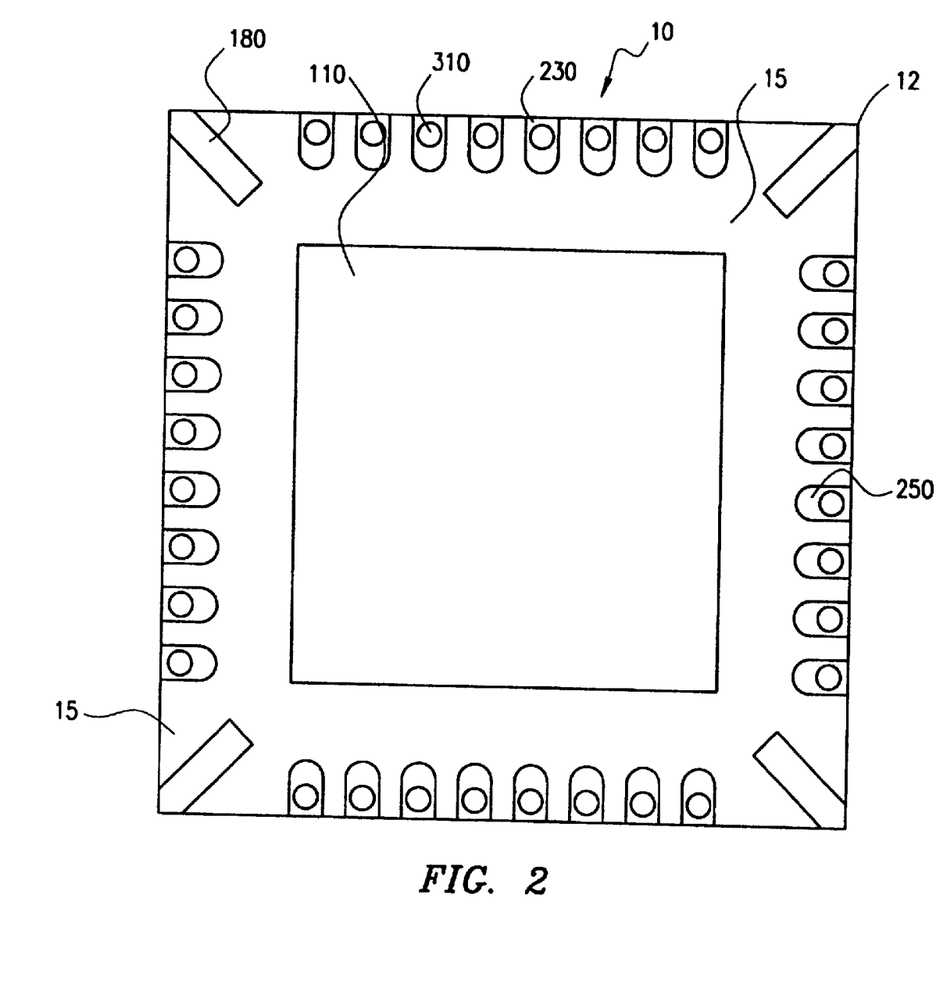
FIG. 2 is a bottom plan view of the semiconductor package of FIG. 1.
Figure 6:
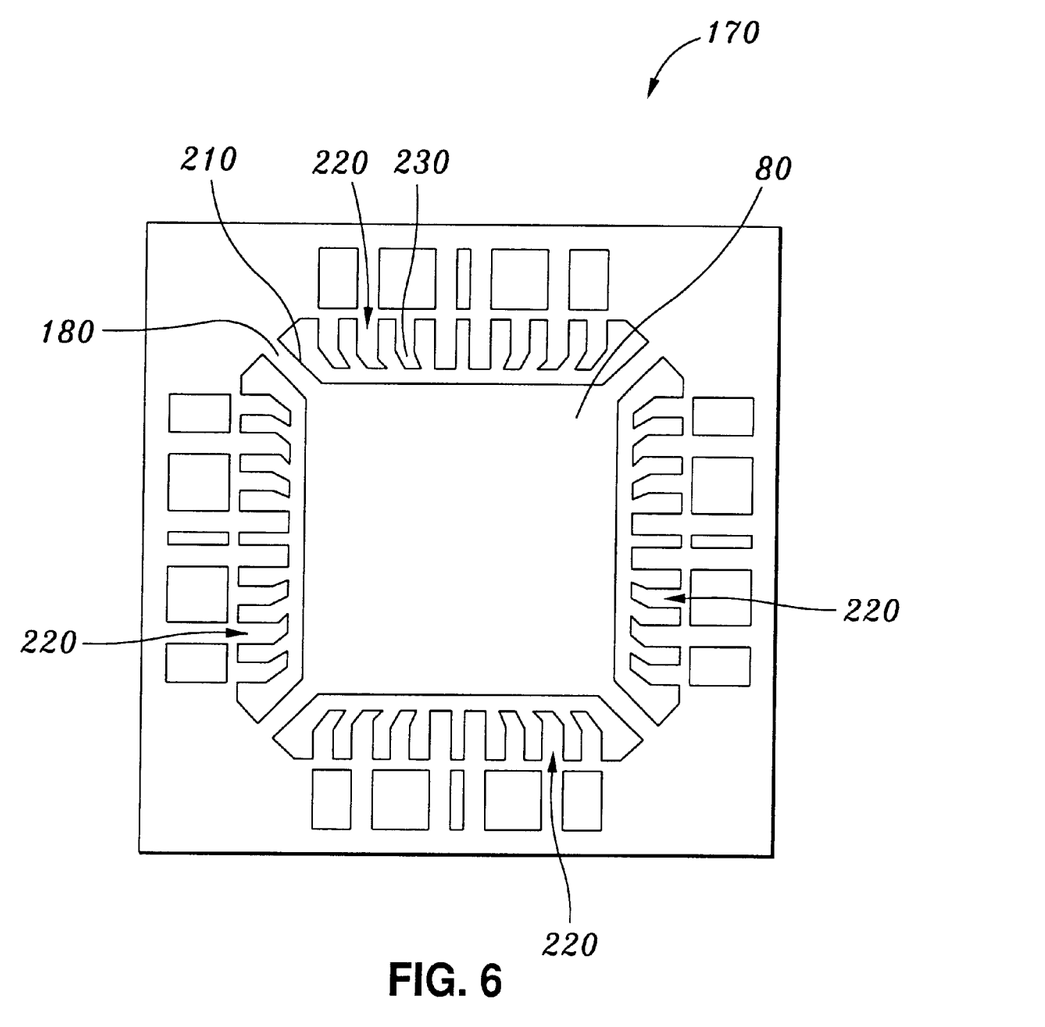
FIG. 6 is a top plan view of a leadframe used to make the semiconductor package of FIG. 1.

Referring now to FIGS. 1, 2 and 6 in combination, a leadframe 170 is shown having a plurality of tie bars 180, a side surface 190 and a bottom surface 200. The tie bars 180 are connected to the corners 130 of the chip paddle 80 and include a bottom section 185. The tie bars 180 externally extend from the chip paddle 80. The leadframe 170 further has a half-etched section 210 and a plurality of dam bars 220.

A plurality of finger-like leads 230 are connected to the leadframe 170 and have an upper surface 235, a side surface 240 and a bottom surface 250. Upper surface 235 may, but does not have to be electroplated with gold or silver. The leads 230 are radially formed at regular intervals along the circumference 140 and spaced apart from the circumference 140 of the chip paddle 80. The leads 230 extend towards the chip paddle 80, such that each of the plurality of leads 230 has a half-etched section 260 facing the chip paddle 80.

To enclose the semiconductor package 10, encapsulation material 280 encapsulates the semiconductor chip 20, conductive wires 270, chip paddle 80, and leads 230. Encapsulation material 280 may be thermoplastics or thermoset resins, with the thermoset resins including silicones, phenolics, and epoxies. The dam bars 220 limit the flow of the encapsulation material 280 on the leadframe 170 and provide stability to the leads 230 on the leadframe 170. During encapsulation, the chip paddle 80, leads 230, and tie bars 180 may be externally exposed at the respective side and bottom surfaces. The respective half-etched sections 150, 210, and 260 of the chip paddle 80, tie bars, 180, and leads 240 are provided to increase the bonding strength of the encapsulation material 280 in the package 10. It is contemplated that the respective half-etched sections 150, 210, and 260 may be eliminated without departing from the scope and spirit of this invention.

Figure 3:
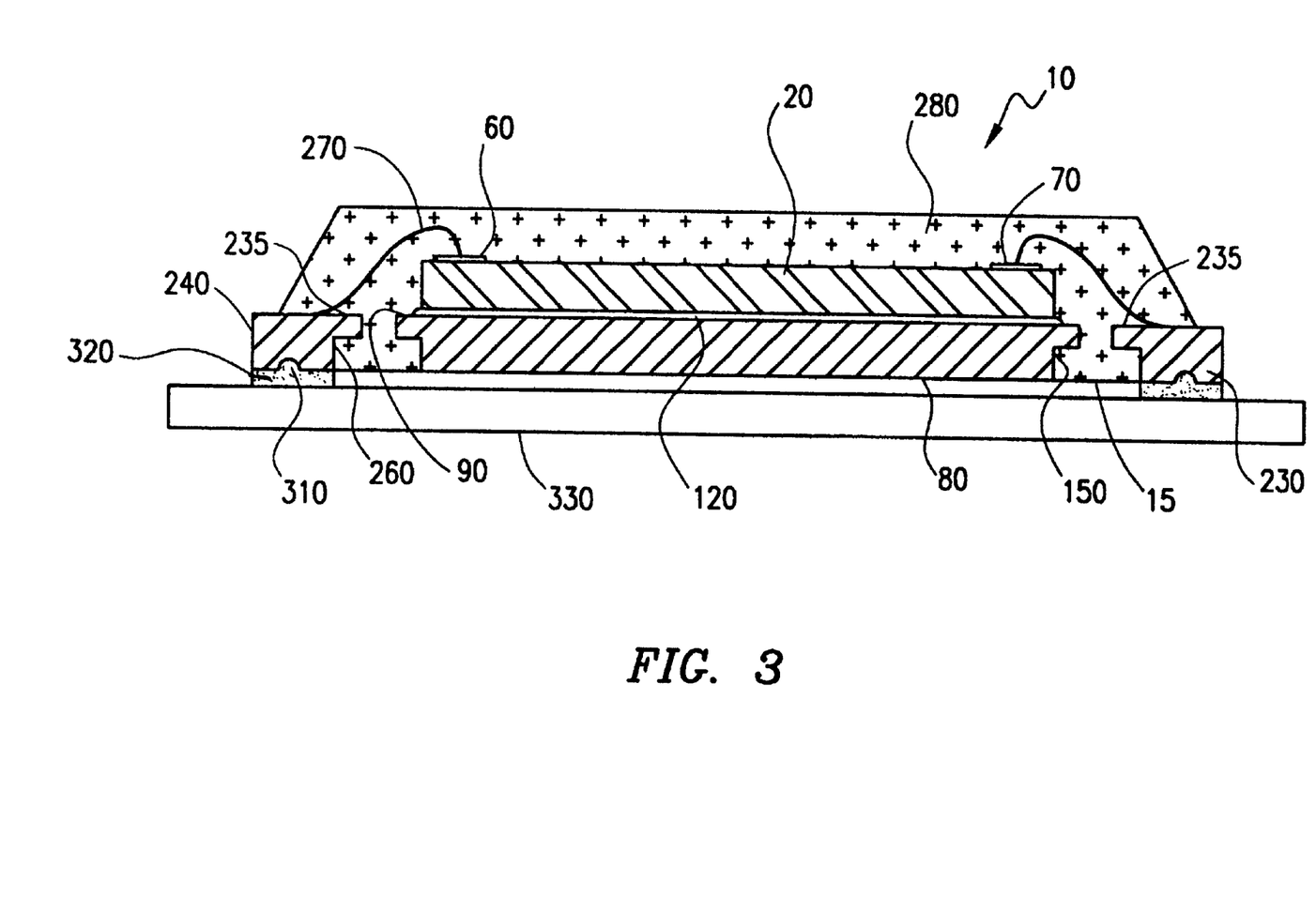
FIG. 3 is a side elevational, cross section view of the semiconductor package of FIGS. 1 and 2 after the semiconductor package has been connected to a motherboard.

In a first embodiment of the present invention, at least one depression 310 is formed on the bottom surface 270 of the leads 250, which are externally exposed on the bottom surface of the semiconductor package 10. The depressions 310 may have various configurations in cross-section, and as such may include but are not limited to rectangular, hemispherical, square, triangular, circular, and omega shapes. The depressions 310 provide additional area on the bottom surface of the semiconductor package for solder 320 to be applied when the package is secured to a motherboard 330, best seen in FIG. 3. When the package is secured to the motherboard 330, the variety of cross-sectional configurations of the depression 310 support the increased solder joint strength between the motherboard 330 and the package 10. As shown in FIGS. 1–3, a plurality of depressions 310 is preferred to maximize the solder joint strength between the package and the motherboard 330. As seen in FIG. 3, the solder 320 expands into the depression 310 and thereby provides increase interlocking location for the solder 320 to expand when the package is secured to the motherboard 330.

The depressions 310 may be formed by a chemical etching process, wherein the depressions 310 are contoured when a typical full etching process is conducted to form a general pattern of the leadframe 170, including the chip paddle 80, tie bars 180, leads 230, and dam bars 220. Alternatively, the depressions 310 may be formed after the typical full etching process for the leadframe 170, wherein the area in which the depressions 310 are to be formed is coated with a photoresist (not shown) while the remaining area of the surface is uncoated. During this alternate process, an enchant (not shown) is sprayed directly over the uncoated area to form the depressions 310. Alternatively, the depressions 310 may be formed by mechanical stamping, wherein a punch is applied to the position at which the depressions 310 are to be formed.

Figure 4:
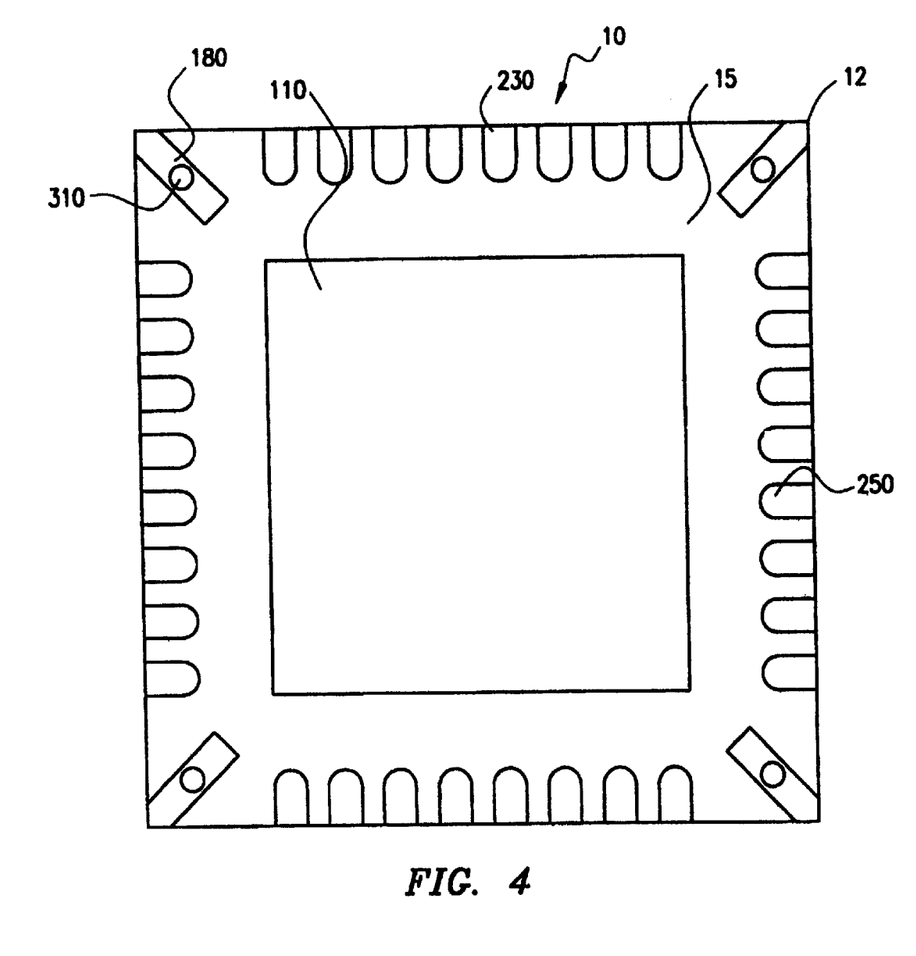
FIG. 4 is a bottom plan view of an alternate embodiment of the semiconductor package of the present invention, wherein depressions are formed on the externally exposed bottom surface of the tie bars.
Figure 5:
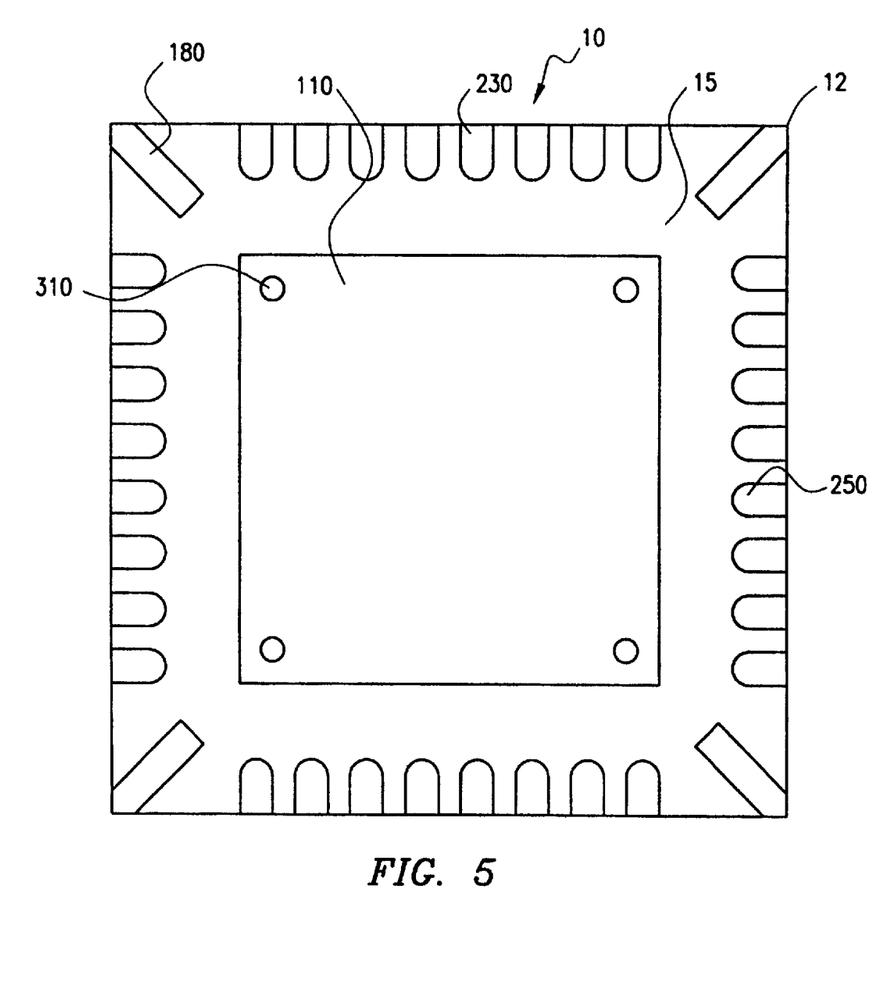
FIG. 5 is a bottom plan view of an alternate embodiment of the semiconductor package of the present invention, wherein depressions are formed on the externally exposed bottom surface of the chip paddle.

In an alternate embodiment shown in FIG. 4, at least one depression 310 is formed on the bottom surface 185 of the tie bars 180. In still another embodiment of the present invention shown in FIG. 5, at least one depression 310 may be formed on the bottom surface 110 of the chip paddle 80. The solder 320 on the bottom surface 110 of the chip paddle 80 further increases the heat radiation performance of the semiconductor chip 20. The depressions 310 formed on the tie bars 180 and chip paddle 80 may be created by any of the methods described above.

The following applications are all being filed on the same date as the present application and all are incorporated by reference as if wholly rewritten entirely herein, including any additional matter incorporated by reference therein:

| Attorney Docket No. | Title of Application | First Named Inventor |
|---|---|---|
| 09/687,487 | Clamp and Heat Block Assembly for Wire Bonding a Semiconductor Package Assembly | Young Suk Chung |
| 09/687,876 | Near Chip Size Semiconductor Package | Sean Timothy Crowley |
| 09/687,495 | Semiconductor Package Improved Locking Strength and Its Manufacturing Method | Sean Timothy Crowley |
| 09/687,531 | Stackable Semiconductor Package and Method for Manufacturing Same | Sean Timothy Crowley |
| 09/687,530 | Stackable Semiconductor Package and Method for Manufacturing Same | Jun Young Yang |
| 09/687,126 | Method of and Apparatus for Manufacturing Semiconductor Packages | Hyung Ju Lee |
| 09/687,493 | Semiconductor Package Having Improved Adhesiveness and Ground Bonding | Sung Sik Jang |
| 09/687,541 | Semiconductor Package Leadframe Assembly and Method of Manufacture | Young Suk Chung |

It is thus believed that the operation and construction of the present invention will be apparent from the foregoing description of the preferred exemplary embodiments. While the print coating supply system for a plurality of coating substances shown is described as being preferred, it will be obvious to a person of ordinary skill in the art that various changes and modifications may be made therein without departing from the spirit and the scope of the invention.

What is claimed is:

1. A semiconductor package comprising:

a semiconductor chip having an upper surface and a bottom surface;

a plurality of bond pads on said upper surface of said semiconductor chip;

a chip paddle having a top surface, a side surface, and a bottom surface, said chip paddle secured to said bottom surface of said semiconductor chip by an adhesive, said chip paddle having corners and a perimeter;

a leadframe having a plurality of tie bars having a side surface and a bottom surface, each of said plurality of tie bars being connected to said corners of said chip paddle, said plurality of tie bars externally extending from said chip paddle, said leadframe having a plurality of dam bars:

a plurality of leads connected to said leadframe, said plurality of leads each having a side surface and a bottom surface, said plurality of leads being radially formed at regular intervals along and spaced apart from said perimeter of said chip paddle and extending toward said chip paddle;

a plurality of conductive wires electrically connected to said plurality of leads and said semiconductor chip;

encapsulation material encapsulating said semiconductor chip, said plurality of conductive wires, said chip paddle, and said plurality of leads to form a package body, wherein flow of said encapsulation material is limited by said plurality of dam bars formed on said leadframe;

wherein said plurality of leads and said plurality of tie bars are externally exposed at respective side and bottom surfaces;

wherein said chip paddle is externally exposed on said bottom surface;

wherein at least one of said plurality of leads has at least one depression formed on said externally exposed bottom surface thereof; and wherein at least one depression is formed on said externally exposed bottom surface of said chip paddle;

said at least one depression on said at least one of said plurality of leads providing a lead interlocking area and said at least one depression on said chip paddle providing a chip paddle interlocking area, said lead interlocking area and said chip paddle interlocking area each being adapted to receive a bonding material therein to secure the semiconductor package to a motherboard, and to increase interlocking strength between the semiconductor package and the bonding material.

2. The semiconductor package of claim 1, wherein at least one depression is formed on said externally exposed bottom surface of at least one of said plurality of tie bars, said at least one depression on said at least one of said plurality of tie bars providing a tie bar interlocking area adapted to receive a bonding material therein to secure the semiconductor package to a motherboard, and to increase interlocking strength between the semiconductor package and the bonding material.

3. The semiconductor package of claim 1, wherein said chip paddle has a half-etched section at a lower edge of said chip paddle along said chip paddle perimeter.

4. The semiconductor package of claim 1, wherein said bond pads are electrically connected to said semiconductor chip.

5. The semiconductor package of claim 1, wherein each of said plurality of leads has a half-etched section facing said chip paddle; said leadframe is provided with a space for receiving said semiconductor chip; and a semiconductor chip is secured to said space.

6. A semiconductor package comprising:

a semiconductor chip having an upper surface and a bottom surface;

a plurality of bond pads on said upper surface of said semiconductor chip;

a chip paddle have a top surface, a side surface and a bottom surface, said chip paddle secured to said bottom surface of said semiconductor chip by an adhesive, said chip paddle having corners and a perimeter;

a leadframe hag a plurality of tie bars having a side surface and a bottom surface, each of said plurality of tie bars being connected to said corners of said chip paddle, said plurality of tie bars eternally extending from said chip paddle, said leadframe having a plurality of dam bars;

a plurality of leads connected to said leadframe, said plurality of leads having a side surface and a bottom surface, said plurality of leads being radially formed at regular intervals along and spaced apart from said perimeter of said chip paddle and extending towards said chip paddle, a plurality of conductive wires electrically connected to said plurality of leads and said semiconductor chip; and encapsulation material encapsulate said semiconductor chip, said plurality of conducve wires, said chip paddle, and said plurality of leads to from a package body, wherein flow of said encapsulation material is limited by said plurality of dam bars formed on said leadframe;

wherein said plurality of leads and said plurality of tie bars are externally exposed at respective side and bottom surfaces;

wherein said chip paddle is externally exposed on said bottom surface; and wherein at least one depression is formed on said externally exposed bottom surface of said chip paddle;

said at least one depression on said chip paddle providing a chip paddle interlocking area adapted to receive a bonding material therein to secure the semiconductor package to a motherboar,d and to increase interlocking strength between the semiconductor package and the bonding material.

7. The semiconductor package of claim 6, wherein at least one of said plurality of leads has at least one depression formed an said externally exposed bottom surface of the respective said plurality of leads, said at least one depression providing a lead interlocking area adapted to receive a bonding material the to secure the semiconductor package to a motherboard, and to increase interlocking strength between the semiconductor package and the bonding material.

8. The semiconductor package of claim 6, wherein at least one depression is formed on said externally exposed bottom surface of at least one of said plurality of tie bars, said at least one depression on said at least one of said plurality of tie bars providing a tie bar interlocking area adapted to receive a bonding material therein to secure the semiconductor package to a motherboard, and to increase interlocking strength between the semiconductor package and the bonding material.

9. The semiconductor package of clam 6, wherein said chip paddle has a halfetched section at a lower edge of said chip paddle along said chip paddle perimeter.

10. The semiconductor package of claim 6, wherein said bond pads are electrically connected to said semiconductor chip.

11. The semiconductor package of claim 6, wherein each of said plurality of leads has a half-etched section facing said chip paddle.

12. A semiconductor package comprising:
a semiconductor chip having an upper surface and a bottom surface;
a plurality of bond pads on said upper surface of said semiconductor chip;
a chip paddle having a top surface, a side surface and a bottom surface said chip paddle secured to said bottom surface of said semiconductor chip by an adhesive, said chip paddle having corners and a perimeter;
a leadframe having a plurality of tie bars having a side surface and a bottom surface each of said plurality of tie bars being connected to said corners of said chip paddle, said plurality of tie bars externally extending from said chip paddle, said leadframe having a plurality of dam bars;
a plurality of leads connected to said leadframe, said plural of leads having a side surface and a bottom surface, said plurality of leads ben radially formed at regular intervals along and spaced apart from said perimeter of said chip paddle and extending towards said chip paddle;
a plurality of conductive wires electrically connected to said plurality of leads and said semiconductor chip;
encapsulation material encapsulating said semiconductor chip, said plurality of conducive wires, said chip paddle, and said plurality of leads to form a package body, wherein flow of said encapsulation material is limited by said plurality of dam bars formed on said leadframe;

wherein said plurality of leads and said plurality of tie bars are externally exposed at respective side and bottom surfaces;

wherein said chip paddle is externally exposed on said bottom surface; and wherein at least one depression is formed on said externally exposed bottom surface of at least one of said plurality of tie bars;

said at one depression on said at least one of said plurality of tie bars providing a tie bar interlocking area adapted to receive a bonding material to secure the semiconductor package to a motherboard, and to increase interlocking strength between the semiconductor package and the bonding material.

13. The semiconductor package of claim 12, wherein at lead one depression is formed on said external exposed bottom surface of said chip paddle, said at least one depression on said chip paddle providing a chip paddle interlocking area adapted to receive a bonding material therein to secure the semiconductor package to a motherboard, and to increase interlocking strength between the semiconductor package and the bonding material.

14. The semiconductor package of claim 12, wherein at least one of said plurality of leads has at least one depression formed on said externally exposed bottom surface of the respective said plurality of leads, said at least one depression providing a lead interlocking area adapted to receive bonding material therein to secure the semiconductor package to a motherboard, and to increase interlocking strength between the semiconductor package and the bonding material.

15. The semiconductor package of claim 12, wherein said chip paddle has a half-etched section at a lower edge of said chip paddle along said chip paddle perimeter.

16. The semiconductor package of claim 12, wherein said bond pads are electrically connected to said semiconductor chip.

17. The semiconductor package of claim 12, wherein each of said plurality of leads a half-etched section facing said chip paddle.

18. A semiconductor package comprising:
a leadframe having a plurality of tie bars having a side surface and a bottom surface, a chip paddle having a top surface, a side surface and a bottom surface, corners and a perimeter, said chip paddle having a space adapted to receive a semiconductor chip, each of said plurality of tie bars being bonded to said corners of said chip paddle, said plurality of tie bars externally extending from said chip paddle, said leadframe having a plurality of dam bars;
a plurality of leads connected to said leadframe, said plurality of leads having a side surface and a bottom surface, said plurality of leads being radially formed at regular intervals along and spaced apart from said perimeter of said chip paddle and extending towards said chip paddle;
wherein said chip paddle is externally exposed on said bottom surface; and
wherein at least one depression is formed on said bottom surface of at least one of said plurality of tie bars;

said at least one depression on said at least one of said plurality of tie bars providing a tie bar interlocking area adapted to receive a bonding material therein to secure the semiconductor package to a motherboard, and to increase interlocking strength between the semiconductor package and the bonding material.

19. The semiconductor package of claim 18, further comprising:
   a semiconductor chip having an upper surface and a bottom surface, said semiconductor chip being secured to said space on said leadframe by an adhesive;
   a plurality of bond pads on said upper surface of said semiconductor chip;
   a plurality of conductive wires electrically connected to said plurality of leads and said semiconductor chip;
   encapsulation material encapsulating said semiconductor clip, said plurality of conductive wires, said chip paddle, and said plurality of leads to form a package body, wherein flaw of said encapsulation material is limited by said plurality of dam bars formed on said leadframe;
   wherein said plurality of leads and said plurality of tie bars are eternally exposed at respective side and bottom surfaces.

20. The semiconductor package of claim 19, wherein at least one depression is formed on said externally exposed bottom surface of said chip paddle, said at least one depression on said chip paddle providing a chip paddle interlocking area adapted to receive a bonding material therein to se the semiconductor package to a motherboard, and to increase interlocking strength between the semiconductor package and the bonding materials.

21. The semiconductor package of claim 19, wherein at least one of said plurality of leads has at least one depression formed on said bottom surface of tie respective said plurality of leads, said at least one depression providing a lead lint rocking area adapted to receive a bonding material therein to secure the semiconductor package to a motherboard, and to increase interlocking strength between the semiconductor package and the bonding material.

22. The semiconductor package of claim 19, wherein said chip paddle has a half-etched section at a lower edge of said chip paddle along said chip paddle perimeter.

23. The semiconductor package of claim 19, wherein said bond pads are electrically connected to said semiconductor chip.

24. The semiconductor package of claim 19, wherein each of said plurality of leads has a half-etched section facing said chip paddle.

25. A system for increasing the interlocking strength between a semiconductor package and bond material, comprising:
   means for ping a semiconductor package comprising:
      a semiconductor chip having an upper surface and a bottom surface;
      a plurality of bond pads on said upper surface of said semiconductor chip;,
      a chip paddle having a top surface a side surface and a bottom set, said chip paddle secured to said bottom surface of said semiconductor chip by an adhesive, said chip paddle having corners and a perimeter;
      a plurality of tie bars having a side surface and a bottom sure, eat of said plurality of tie bars being connected to said corners of said chip paddle, said plurality of tie bars externally extending from said chip paddle, said leadframe having a plurality of darn bars;
   a plurality of leads having a side and a bottom surface, said plurality of leads being radially formed at regular intervals along and spaced apart from said perimeter of said chip paddle and extending towards said chip paddle;
   a plurality of conductive wires electrically connected to said plurality of leads and said semiconductor chip;
   encapsulation material encapsulating said semiconductor chip, said plurality of conductive wires, said chip paddle, and said plurality of leads to form a package body;
   means for externally exposing said plurality of leads and said plurality of tie bars at respective side and bottom surfaces;
   means for externally exposing said chip paddle on said bottom surface;
   means for forming at least one depression is formed on said externally exposed bottom surface of at least one of said plurality of tie bars;
   means for forming at least one depression is formed on said externally exposed bottom surface of at least one of said plurality of leads;
   means for forming at least one depression is formed on said externally exposed bottom surface of said chip paddle; and
   means for forming an interlocking area on said at least one depression formed on at least one of said plurality of tie bars, at least one of said plurality of leads and said chip paddle, said interlocking area being adapted to receive a bonding material therein to secure said semiconductor package to a motherboard, and to increase interlocking strength between said semiconductor package and the bonding material.

26. A semiconductor package comprising:
   a semiconductor chip having an upper surface and a bottom surface;
   a plurality of bond pads on said upper surface of said semiconductor chip;
   a chip paddle having a top surface, a side surface and a bottom surface, said chip paddle secured to said bottom surface of said semiconductor chip by an adhesive, said chip paddle having corners and a perimeter;
   a leadframe having a plurality of tie bars having a side surface and a bottom surface, each of said plurality of tie bars being connected to said corners of said chip paddle, said plurality of tie bars externally extending from said chip paddle, said leadframe having a plurality of dam bars;
   a plurality of leads connected to said leadframe, said plurality of leads each having a side surface and a bottom surface, said plurality of leads being radially formed at regular intervals along and spaced apart from said perimeter of said chip paddle and extending toward said chip paddle;
   a plurality of conductive wires electrically connected to said plurality of leads and said semiconductor chip;
   encapsulation material encapsulating said semiconductor chip, said plurality of conductive wires, said chip paddle, and said plurality of leads to form a package body, wherein flow of said encapsulation material is limited by said plurality of dam bars formed on said leadframe;
   wherein said plurality of leads and said plurality of tie bars are externally exposed at respective side and bottom surfaces;
   wherein said chip paddle is externally exposed on said bottom surface;

wherein at least one of said plurality of leads has at least one depression formed on said externally exposed bottom surface thereof; and wherein at least one depression is formed on said externally exposed bottom surface of at least one of said plurality of tie bars;

said at least one depression on said at least one of said plurality of leads providing a lead interlocking area and said at least one depression on said at least one of said plurality of tie bars providing a tie bar interlocking area, said lead interlocking area and said tie bar interlocking area each being adapted to receive a bonding material therein to secure the semiconductor package to a motherboard, and to increase interlocking strength between the semiconductor package and the bonding material.

27. The semiconductor package of claim 26, wherein at least one depression is formed on said externally exposed bottom surface of said chip paddle, said at least one depression on said chip paddle providing a chip paddle interlocking area adapted to receive a bonding material therein to secure the semiconductor package to a motherboard, and to increase interlocking strength between the semiconductor package and the bonding material.

28. The semiconductor package of claim 26, wherein said chip paddle has a half-etch section at a lower edge of said chip paddle along said chip paddle perimeter.

29. The semiconductor package of claim 26, wherein said bond pads are electrically connected to said semiconductor chip.

* * * * *